United States Patent
Seong et al.

(10) Patent No.: US 8,227,283 B2
(45) Date of Patent: Jul. 24, 2012

(54) TOP-EMITTING N-BASED LIGHT EMITTING DEVICE AND METHOD OF MANUFACTURING THE SAME

(75) Inventors: Tae-yeon Seong, Seoul (KR); Tak-hee Lee, Gwangju-si (KR); Dong-seok Leem, Gwangju-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 325 days.

(21) Appl. No.: 11/812,305

(22) Filed: Jun. 18, 2007

(65) Prior Publication Data
US 2008/0006842 A1   Jan. 10, 2008

(30) Foreign Application Priority Data
Jun. 22, 2006   (KR) .......................... 10-2006-0056373

(51) Int. Cl.
*H01L 21/00* (2006.01)
(52) U.S. Cl. ................................. 438/47; 257/E33.074
(58) Field of Classification Search .................... 438/47; 257/E33.074
See application file for complete search history.

(56) References Cited

U.S. PATENT DOCUMENTS

| | | | | |
|---|---|---|---|---|
| 3,739,217 A * | 6/1973 | Bergh et al. | ................... | 313/499 |
| 5,779,924 A * | 7/1998 | Krames et al. | ................... | 216/24 |
| 6,280,861 B1 * | 8/2001 | Hosokawa et al. | ........... | 428/690 |
| 6,669,830 B1 | 12/2003 | Inoue et al. | | |
| 6,743,476 B2 * | 6/2004 | Hishida | ......................... | 427/271 |
| 2003/0059972 A1 * | 3/2003 | Ikeda et al. | ..................... | 438/47 |
| 2003/0062530 A1 | 4/2003 | Okazaki et al. | | |
| 2004/0041164 A1 * | 3/2004 | Thibeault et al. | .............. | 257/98 |
| 2006/0054921 A1 | 3/2006 | Murakami et al. | | |
| 2009/0184329 A1 | 7/2009 | Miki et al. | | |

FOREIGN PATENT DOCUMENTS

| | | |
|---|---|---|
| JP | 2002-344019 | 11/2002 |
| JP | 2005-039197 | 2/2005 |
| JP | 2006-066903 | 3/2006 |
| JP | 2006-080426 | 3/2006 |
| WO | 01-38599 | 5/2001 |

OTHER PUBLICATIONS

Tsai et al., "Wet etching mechanisms of ITO films in oxalic acid", Dec. 28, 2005, Microelectronic Engineering, vol. 83, p. 536-541).*
Schnitzer, I. and Yablonovitch, E.; "30% external quantum efficiency from surface textured, thin-film light-emitting diodes"; Oct. 18, 1993; Applied Physics Letters; 63 (16); p. 2174-2176.*
Japanese Office Action dated Jan. 31, 2012.

* cited by examiner

*Primary Examiner* — Stephen W Smoot
*Assistant Examiner* — Vicki B Booker
(74) *Attorney, Agent, or Firm* — Harness, Dickey & Pierce, P.L.C.

(57) ABSTRACT

Provided is a top-emitting N-based light emitting device and a method of manufacturing the same. The N-based light emitting device may include an n-type clad layer, an active layer, a p-type clad layer, and a transparent conductive thin film which may be sequentially stacked on a substrate. The transparent conductive thin film may have a surface nano-scale patterned by wet-etching and then annealing without using a mask for improving the light extraction rate. A light emitting device having a higher brightness may be prepared by increasing or maximizing the light extraction rate by employing the transparent conductive thin film having the surface patterned by wet-etching and then annealing.

11 Claims, 9 Drawing Sheets

TOP-EMITTING N-BASED LIGHT EMITTING DEVICE AND METHOD OF MANUFACTURING THE SAME

PRIORITY STATEMENT

This application claims priority under 35 USC §119 to Korean Patent Application No. 2006-0056373, filed on Jun. 22, 2006, in the Korean Intellectual Property Office (KIPO), the entire contents of which are herein incorporated by reference.

BACKGROUND

1. Field

Example embodiments relate to a top-emitting N-based light emitting device with an increased light extraction rate including a nano-scale patterned transparent conductive thin film that is prepared by wet-etching and annealing the surface of the transparent conductive thin film without using a mask, and a method of manufacturing the same.

2. Description of Related Art

When a light emitting device is formed using an N-based compound semiconductor (e.g., GaN-based compound semiconductor), a process of forming a high quality ohmic contact between the semiconductor and the electrode is required. However, even though much research on light emitting devices using N-based compound semiconductors has been recently conducted, a high quality ohmic contact cannot easily be obtained because a p-GaN has low carrier concentration, high sheet resistance, and low electrical conductivity. Thus, the high quality ohmic contact of the p-GaN using a metal electrode becomes more essential to provide a good current spreading in the light emitting device. Particularly, a high quality ohmic contact having low specific contact resistance and high light transmittance is required because light generated in a top-emitting light emitting device exits through the ohmic electrode.

A structure in which nickel and gold are laminated on a p-type clad layer is typically used as an ohmic contact structure in top-emitting light emitting devices. The Ni/Au ohmic contact structure annealed in an oxygen or air atmosphere has been known to form a semi-transparent ohmic contact layer with low specific contact resistance of about $10^{-3}$ to $10^{-4}$ $cm^2$. However, the conventional Ni/Au ohmic contact layer is not suitable for use in large capacity and high brightness light emitting devices due to the low light extraction rate by having a low light transmittance of about 75% when the thickness of the layer is 450 nm. Thus, research involving using a transparent conductive oxide (e.g., ITO) having a better light transmittance than a semi-transparent Ni/Au structure, which is used as a conventional p-ohmic contact layer, has been conducted in order to improve the limited output power of such top-emitting light emitting devices. A top-emitting light emitting device having an improved light output power of about 1.3 times has been developed by employing an Ni/ITO ohmic contact layer which has a light transmittance of 86.6%, which is higher than the light transmittance of the conventional Ni/Au ohmic contact layer of about 71.1% when the thickness of the layer is 450 nm.

Electrode-surface texturing has been recently introduced in an effort to maximize the light extraction rate of light emitting devices. A light emitting device has improved light output power of about 16% by forming a p-type GaN ohmic contact layer using an NiO/ITO structure, patterning an ITO electrode having micro-scale holes using conventional photolithography and dry etching, and employing the patterned ITO electrode to a light emitting device. In addition, a method of forming one dimensional stripe-shaped patterns through interferometric exposure and electron beam exposure using He—Cd laser, Ar laser, or etc. has been developed.

A method of improving external quantum efficiency of a light emitting device by employing a light extraction structure composed of light extraction elements (LEEs), disperser layers, or similar on the surface of the light emitting device using dry-etching employing a photoresist mask and reactive ion etching (RIE) has been developed.

However, electrode-surface texturing and patterning require additional processes involving a mask and dry-etching. Thus, these methods are not effective for manufacturing light emitting devices. The electrode-surface may be damaged by the dry-etching process in the manufacturing of the N-based light emitting devices. Further, the light extraction rate of light emitting devices that emit light having a wavelength in the range of 400 to 500 nm cannot be maximized because the light emitting devices manufactured by these electrode-surface texturing and patterning methods have micro-meter sized hole patterns.

SUMMARY

Example embodiments provide an N-based light emitting device including an electrode structure having an increased light extraction rate by inducing a diffused reflection of light generated in the light emitting device at an interface by nano-scale patterning a p-type ohmic electrode comprising a transparent conductive thin film using wet-etching and annealing without using a mask, and a method of manufacturing the same.

According to example embodiments, a method of manufacturing an N-based light emitting device may include forming a transparent conductive thin film on a p-type clad layer of a light emitting structure in which an n-type clad layer, an active layer, and the p-type clad layer may be sequentially stacked on a substrate, wet-etching the transparent conductive thin film, and annealing the wet-etched transparent conductive thin film.

The transparent conductive thin film may be formed of a transparent conductive oxide which may be an oxide of at least one selected from the group consisting of In, Sn, Zn, Ga, Ce, Cd, Mg, Be, Ag, Mo, V, Cu, Ir, Rh, Ru, W, Co, Ni, Mn, Al, and La.

A dopant may be added to the transparent conductive oxide in order to improve the electrical conductive properties of the transparent conductive thin film, and the dopant may include at least one of the metals listed on the periodic table.

The transparent conductive thin film may be formed using electron-beam evaporation, sputtering, plasma laser deposition (PLD), dual-type thermal evaporation, physical vapor deposition (PVD), or chemical vapor deposition (CVD). The transparent conductive thin film may be formed to a thickness within the range of about 10 to 1000 nm.

The method of manufacturing an N-based light emitting device may further include forming a metal thin film having a thickness within the range of about 0.1 to 50 nm on the p-type clad layer prior to forming the transparent conductive thin film. The metal thin film may be formed of one metal selected from the group consisting of Ni, Co, Cu, Pd, Pt, Ru, Ir, Au, Ag, Cr, Rh, In, Sn, Mg, Zn, Be, Sr, and Ba, or an alloy, or a solid solution comprising of two or more of the metals.

The wet-etching of the transparent conductive thin film may be performed using an undiluted solution selected from the group consisting of buffered oxide etch (BOE), hydrofluoric acid (HF), hydrochloric acid (HCl), nitric acid ($HNO_3$), phosphoric acid ($H_3PO_4$), sulfuric acid ($H_2SO_4$), potassium hydroxide (KOH), oxalic acid, tartaric acid, formic acid, acetic acid, and glycolic acid, a mixture of the undiluted solutions, a diluted solution of the undiluted solution, or a mixture of the undiluted solutions diluted in deionized water. The transparent conductive thin film may be wet-etched at a temperature within the range of about room temperature to 300° C. for approximately 0.1 seconds to 1 hour.

The wet-etched transparent conductive thin film may be annealed at a temperature within the range of about room temperature to 900° C. for approximately 10 seconds to 3 hours in a vacuum or a gas ambient containing at least one of nitrogen ($N_2$), argon (Ar), helium (He), oxygen ($O_2$), hydrogen ($H_2$), and air.

According to example embodiments, an N-based light emitting device may include a substrate, an n-type clad layer, an active layer, and the p-type clad layer on the substrate, a wet-etched, annealed, transparent conductive thin film on the p-type clad layer.

According to example embodiments, an N-based light emitting device may include a transparent conductive thin film on a p-type clad layer of a light emitting structure in which an n-type clad layer, an active layer, and the p-type clad layer may be sequentially stacked on a substrate, the transparent conductive thin film having been wet-etched and then annealed.

BRIEF DESCRIPTION OF THE DRAWINGS

Example embodiments will be more clearly understood from the following detailed description taken in conjunction with the accompanying drawings. FIGS. 1-9C represent non-limiting, example embodiments as described herein.

DETAILED DESCRIPTION OF EXAMPLE EMBODIMENTS

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
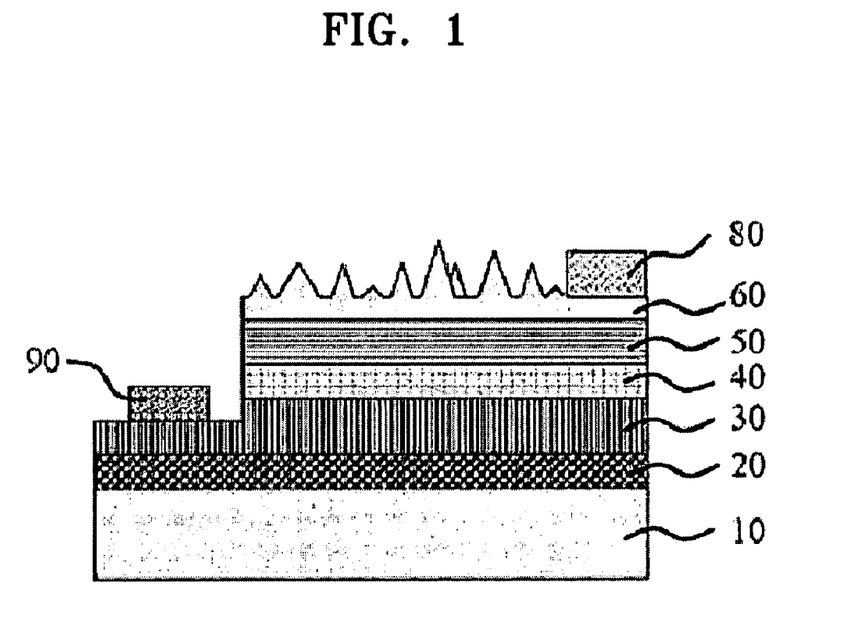
FIG. 1 is a cross-sectional view of a top-emitting light emitting device according to an example embodiment.

FIG. 1 is a cross-sectional view of a top-emitting light emitting device according to an example embodiment.

Referring to FIG. 1, an N-based light emitting device according to an example embodiment may include a substrate 10, a buffer layer 20, an n-type clad layer 30, an active layer 40, a p-type clad layer 50, and a surface-patterned transparent conductive thin film 60 which may be sequentially stacked. The N-based light emitting device may further include an n-electrode pad 90 and a p-electrode pad 80.

The N-based light emitting device may be divided into a light emitting structure including the substrate 10, the buffer layer 20, the n-type clad layer 30, the active layer 40, and the p-type clad layer 50, and a p-ohmic electrode structure including the transparent conductive thin film 60 formed on the p-type clad layer 50.

The substrate 10 may be formed of one of sapphire ($Al_2O_3$), silicon carbide (SiC), Si, and gallium arsenide (GaAs). The buffer layer 20 is an optional component and thus, may not be formed.

Each of the layers from the buffer layer 20 up to the p-type clad layer 50 may include a compound selected from Group III N-based compounds represented by the formula $Al_xIn_yGa_zN$ ($0 \leq x < 1$, $0 \leq y < 1$, $0 < z \leq 1$, and $0 < x+y+z \leq 1$) as its main component, and the n-type clad layer 30 and the p-type clad layer 50 may contain appropriate dopants in addition to the compound.

The active layer 40 may include various known structures, for example, a single layer or a multiquantum well (MQW) layer. When each layer is formed of a GaN-based compound, the buffer layer 20 may be formed of GaN, the n-type clad layer 30 may contain an n-type dopant (e.g., Si, Ge, Se, or Te) in addition to GaN, the active layer 40 may have an InGaN/GaN MQW or an AlGaN/GaN MQW structure, and the p-type clad layer 50 may contain a p-type dopant (e.g., Mg, Zn, Ca, Sr, or Be) in addition to GaN.

A n-ohmic contact layer (not shown) may be interposed between the n-type clad layer 30 and the n-electrode pad 90 and may include various known structures, for example, a structure comprising of a Ti/Al bilayer. The p-electrode pad 80 may include an Ni/Au, W/Au, Pt/Au, Pd/Au, or Ag/Au bilayer.

Each of the layers may be formed using one of known methods, for example, electron-beam evaporation, physical vapor deposition (PVD), chemical vapor deposition (CVD), plasma laser deposition (PLD), dual-type thermal evaporation, and sputtering.

The surface-patterned transparent conductive thin film 60 may be formed by depositing a transparent conductive thin film, wet-etching the transparent conductive thin film, and then annealing the wet-etched transparent conductive thin film. The surface-patterned transparent conductive thin film 60 may have a thickness within 10 to about 1000 nm.

The transparent conductive thin film may be formed of a transparent conductive oxide which may be an oxide of at least one selected from the group consisting of In, Sn, Zn, Ga, Ce, Cd, Mg, Be, Ag, Mo, V, Cu, Ir, Rh, Ru, W, Co, Ni, Mn, Al, and La.

The deposited transparent conductive thin film may be wet-etched using an undiluted solution selected from the group consisting of buffered oxide etch (BOE), hydrofluoric acid (HF), hydrochloric acid (HCl), nitric acid ($HNO_3$), phosphoric acid ($H_3PO_4$), sulfuric acid ($H_2SO_4$), potassium hydroxide (KOH), oxalic acid, tartaric acid, formic acid, acetic acid, and glycolic acid, a diluted solution of the undiluted solution, a mixture of undiluted solutions, or a mixture of undiluted solutions diluted in deionized water. The transparent conductive thin film may be wet-etched at a temperature within the range from about room temperature to 300° C. for approximately 0.1 seconds to 1 hour.

The wet-etched transparent conductive thin film may be annealed at a temperature within the range from about room temperature to 900° C. for approximately 10 seconds to 3 hours to form the surface-patterned transparent conductive thin film 60. The annealing may be performed in a vacuum or a gas ambient containing at least one of nitrogen ($N_2$), argon (Ar), helium (He), oxygen ($O_2$), hydrogen ($H_2$), and air.

Figure 2:
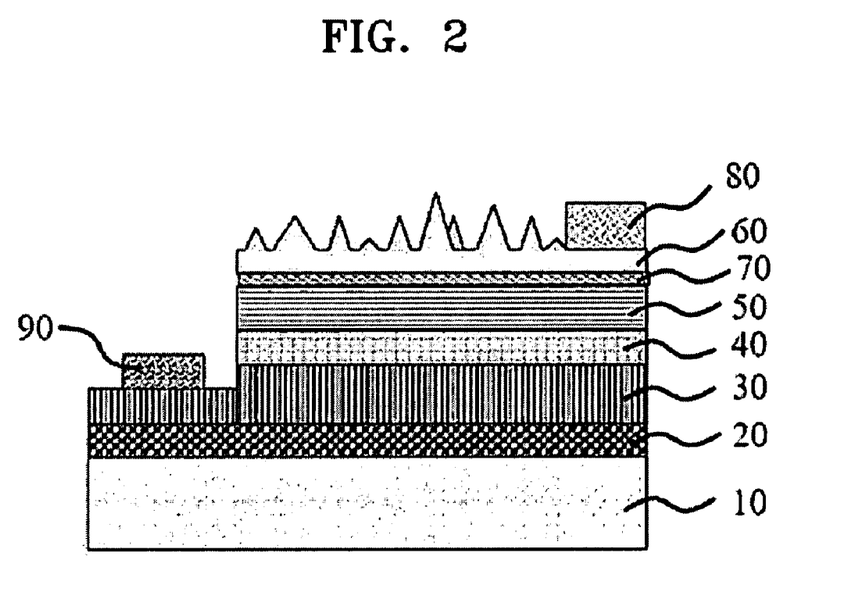
FIG. 2 is a cross-sectional view of a top-emitting light emitting device according to an example embodiment.

FIG. 2 is a cross-sectional view of a top-emitting light emitting device according to an example embodiment.

The top-emitting light emitting device according to an example embodiment may include a metal thin film 70 between the transparent conductive thin film 60 and the p-type clad layer 50 for improving ohmic contact between the surface-patterned transparent conductive thin film 60 and the p-type clad layer 50. The metal thin film 70 may have a thickness within about 0.1 to 50 nm.

The metal thin film may have higher conductivity and higher work function. The metal thin film may be formed of a conductive material that forms a Ga-based compound (e.g., one selected from the group consisting of Ni, Co, Cu, Pd, Pt, Ru, Ir, Au, Ag, Cr, Rh, In, Sn, Mg, Zn, Be, Sr, and Ba, or an alloy, or a solid solution comprising of two or more of the metals).

Because the metal thin film 70 may have higher conductivity, the specific contact resistance of the p-ohmic electrode structure may be reduced by inducing improved current spreading when the metal thin film 70 is in contact with the surface-patterned transparent conductive thin film 60.

Figure 3:
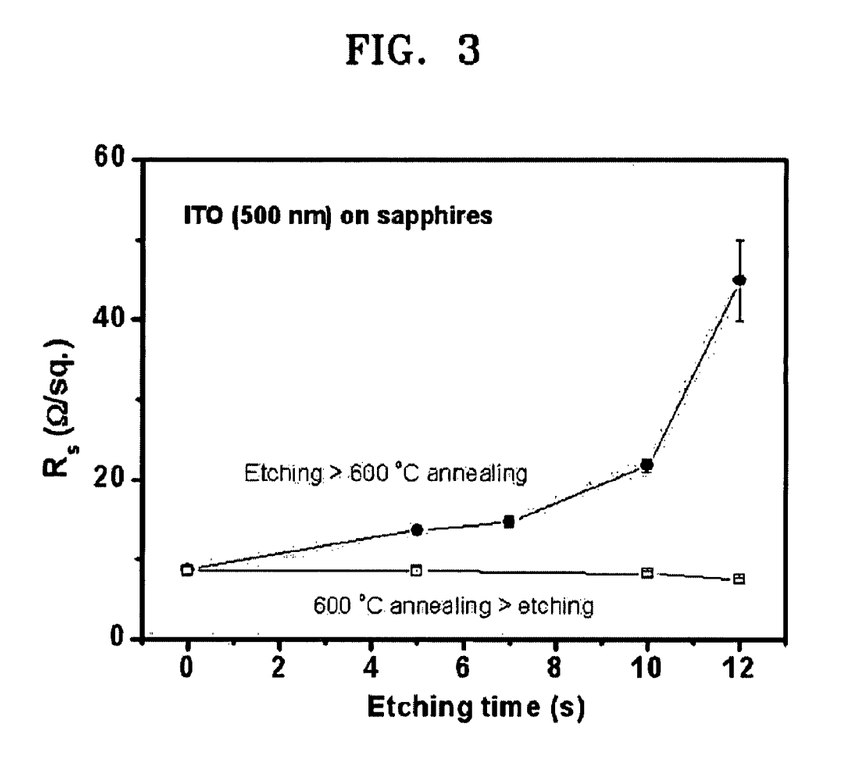
FIG. 3 is a graph illustrating sheet resistance of ITO electrodes manufactured using a first patterning method including wet-etching and then annealing according to an example embodiment, and manufactured using a second patterning method including annealing and then wet-etching according to a comparative example of a conventional method.

FIG. 3 is a graph illustrating the sheet resistance of ITO electrodes manufactured using a first patterning method of wet-etching and annealing according to an example embodiment, and manufactured using a second patterning method of annealing and wet-etching according to a comparative example of a conventional method.

An ITO electrode may be deposited on a sapphire substrate to a thickness of about 500 nm using an electron-beam evaporator. The ITO electrode may be etched using a diluted BOE solution in which the ratio of BOE to deionized water may be about 1:10. The etched ITO may be annealed at approximately 600° C. for about 3 minutes to pattern the surface of the ITO electrode according to an example embodiment. In comparison, an ITO electrode may be deposited on a sapphire substrate to a thickness of about 500 nm using an electron-beam evaporator. The ITO electrode may be annealed at approximately 600° C. for about 3 minutes. The annealed ITO electrode may be etched using a diluted BOE solution in which the ratio of BOE to deionized water may be about 1:10 to pattern the surface of the ITO electrode according to the conventional method.

When the surface of the ITO electrode is etched and then annealed according to an example embodiment, the sheet resistance of the ITO electrode may continuously increase over etching time. On the other hand, when the surface of the ITO electrode is annealed and then etched, a constant sheet resistance of the ITO electrode may be maintained regardless of the etching time.

Figure 4A:
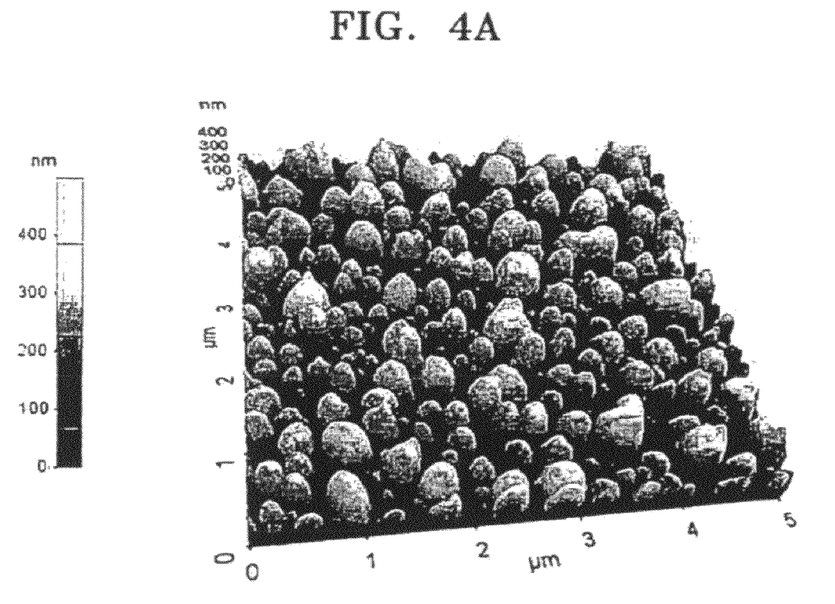
FIGS. 4A and 4B are atomic force microscope (AFM) images of the surface of ITO electrodes manufactured using patterning methods according to an example embodiment and according to a comparative example of a conventional method, respectively.
Figure 4B:
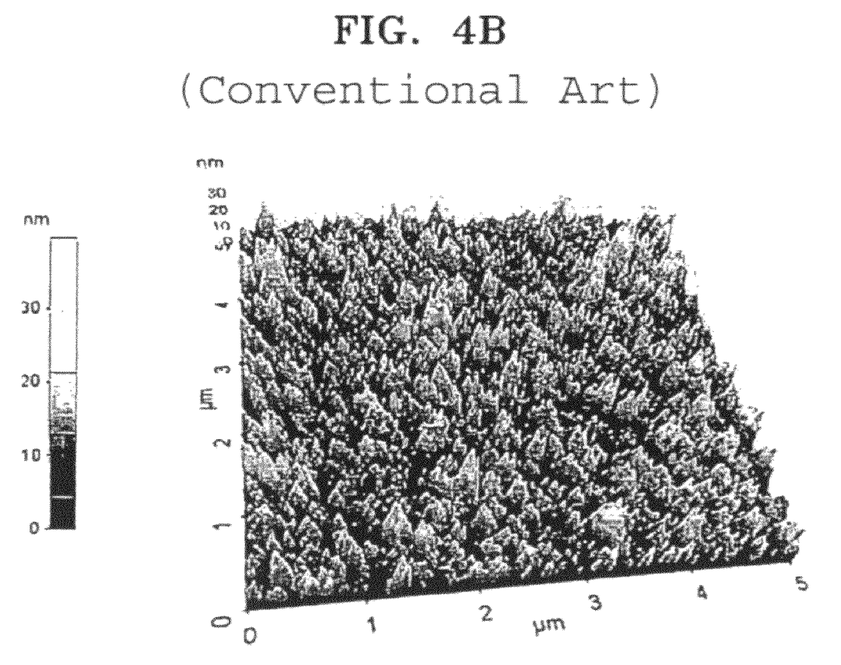

FIGS. 4A and 4B are atomic force microscope (AFM) images of the surface of ITO electrodes manufactured using patterning methods according to an example embodiment and according to a comparative example of a conventional method, respectively. The surface of the ITO electrode etched using a diluted BOE solution and then annealed at approximately 600° C. may be roughly patterned as illustrated in FIG. 4A. The surface of the ITO electrode annealed at approximately 600° C. and then etched using a diluted BOE solution may not be roughly patterned as illustrated in FIG. 4B. When measuring the root mean square roughness using an AFM, there may be a large difference between the root mean square roughness of the surface of the ITO electrode that was etched and then annealed according to an example embodiment, which may be about 81.6 nm, and the root mean square roughness of the surface of the ITO electrode that was annealed and then etched according to the conventional method, which may be about 4.4 nm. Thus, the wet-etching-annealing surface patterning method may be more effective in comparison to the annealing-etching surface patterning method. Because the ITO electrode may have an amorphous surface before annealing and a polycrystalline surface after annealing, the surface of the ITO electrode may be etched differently before annealing and after annealing.

Figure 5A:
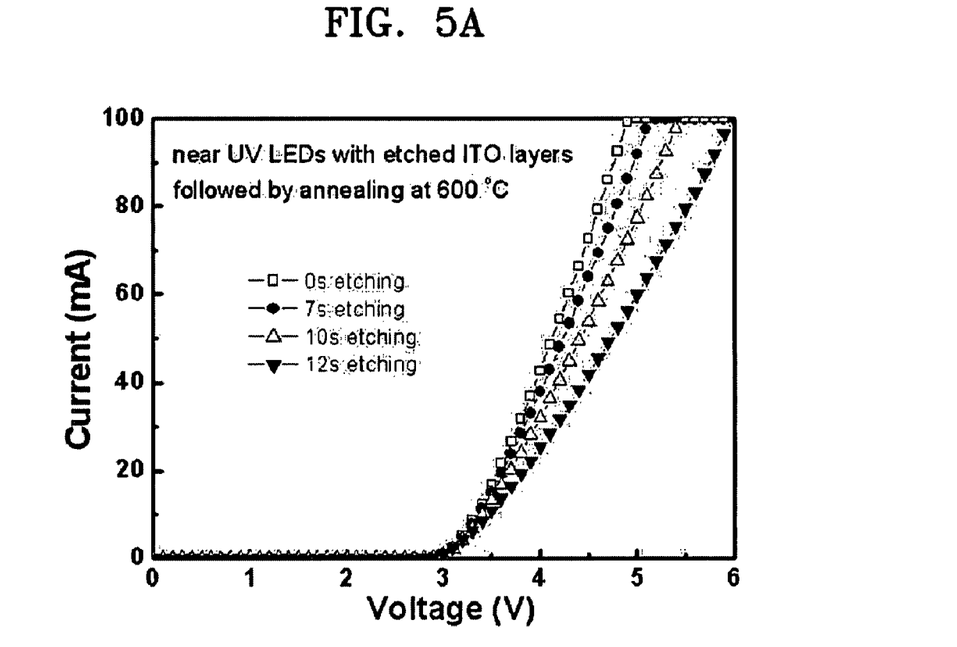
FIGS. 5A and 5B are graphs illustrating electrical characteristics of a near-ultraviolet light emitting device including a p-type electrode which may be patterned using wet-etching and annealing according to an example embodiment.
Figure 5B:
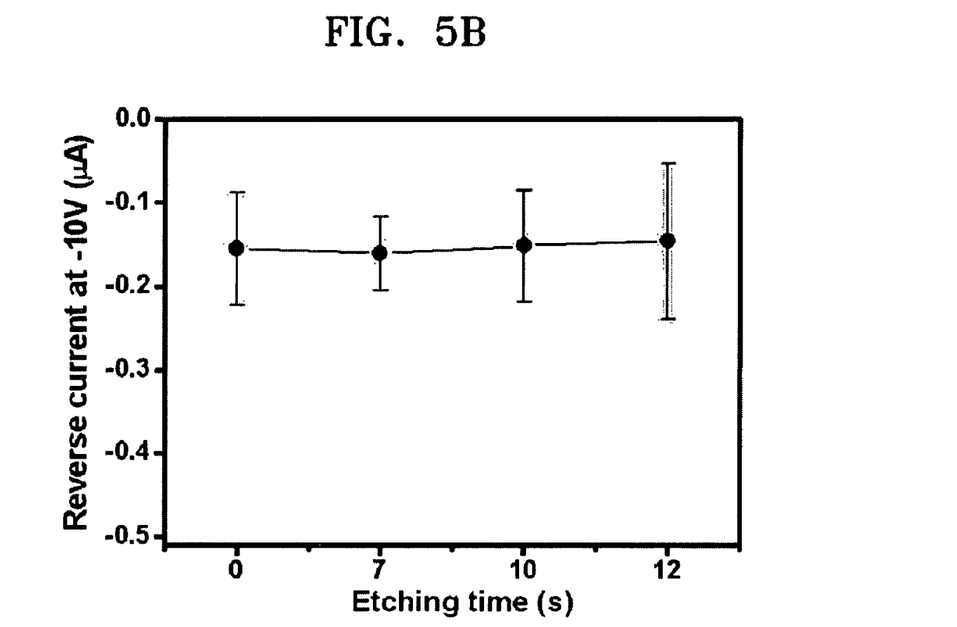

FIGS. 5A and 5B are graphs illustrating electrical characteristics of a near-ultraviolet ray InGaN/GaN MQW light emitting device including a surface-patterned ITO transparent conductive thin film 60 on a p-type clad layer 50 according to an example embodiment. A metal thin film 70 may be deposited to a thickness of about 3 nm using Ag to improve ohmic contact between the ITO transparent conductive thin film 60 and the p-type clad layer 50, and the surface-patterned ITO transparent conductive thin film 60 may be formed by etching using a diluted BOE solution and then annealing at approximately 600° C. FIG. 5A illustrates current-voltage characteristics of a light emitting device including a surface-patterned ITO transparent conductive thin film for various etching times. The operation voltages of the light emitting device may be about 3.57 V, 3.61 V, 3.70 V, and 3.83 V for etching times of about 0 second, 7 seconds, 10 seconds, and 12 seconds, respectively, at approximately 20 mA.

FIG. 5B illustrates reverse currents of the light emitting device at about −10V, and the reverse currents may be maintained regardless of the etching time. Thus, the light emitting device including the surface-patterned ITO electrode using wet-etching and then annealing may have improved electrical characteristics by reducing the degradation of electrical characteristics (e.g., reverse current) that may occur in conventional light emitting devices including dry-etched ITO due to plasma damage.

Figure 6:
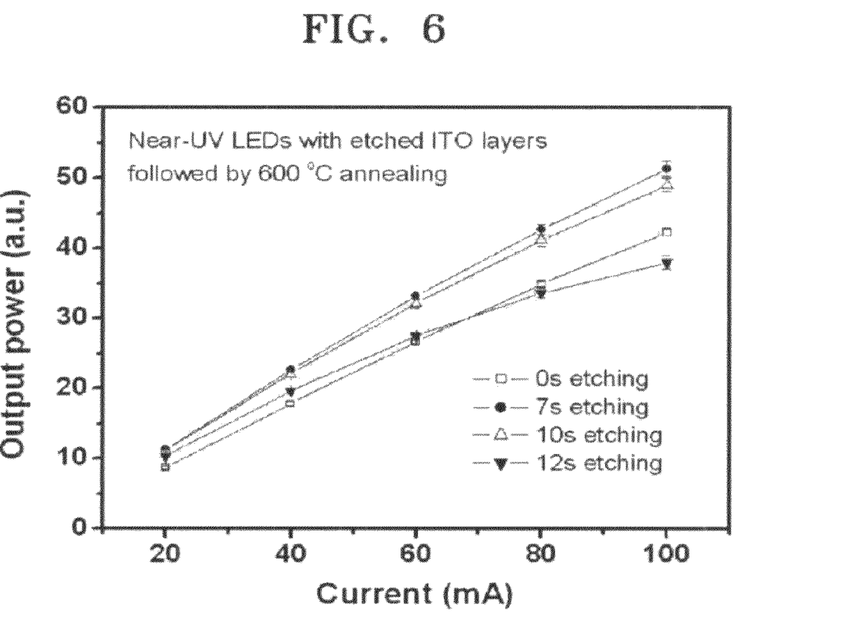
FIG. 6 is a light output power-current (L-I) graph of a near-ultraviolet light emitting device including a p-type electrode that may be patterned by wet-etching and annealing according to an example embodiment.

FIG. 6 is a light output power-current (L-I) graph of the light emitting devices illustrated in FIGS. 5A and 5B. Referring to FIG. 6, the light emitting device including the surface-patterned ITO electrode may have better light output power at about 20 mA in comparison to the light emitting device that may not be surface-patterned (e.g., etching for 0 seconds). For example, the light emitting device having the ITO electrode patterned by wet-etching for about 7 seconds and then annealing may have an improved light output power of about 32%, and the light emitting device having the ITO electrode patterned by wet-etching for about 12 seconds and then annealing may have an improved light output power of about 19%.

Figure 7A:
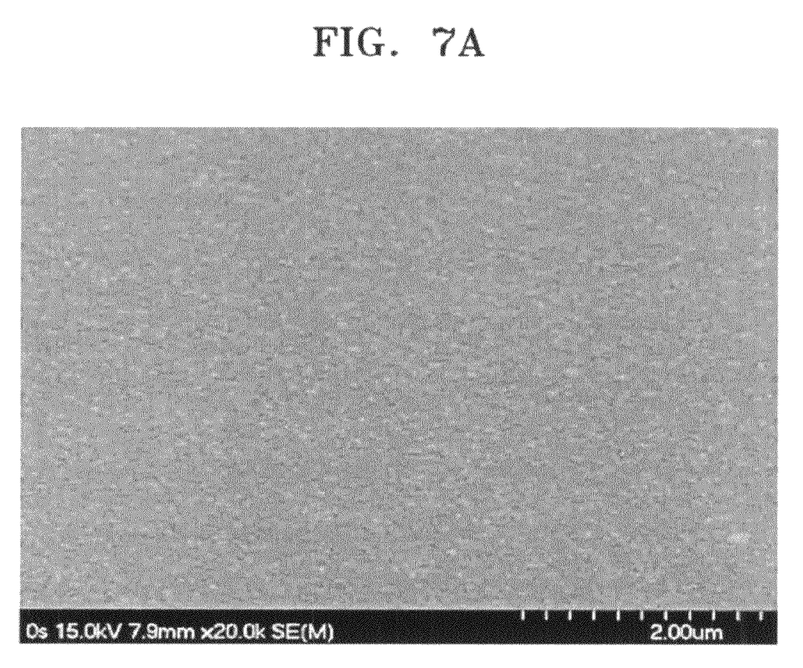
FIGS. 7A to 7C are scanning electron microscope (SEM) images of the surface of a p-type electrode of a near-ultraviolet light emitting device patterned by wet-etching and annealing according to an example embodiment.
Figure 7B:
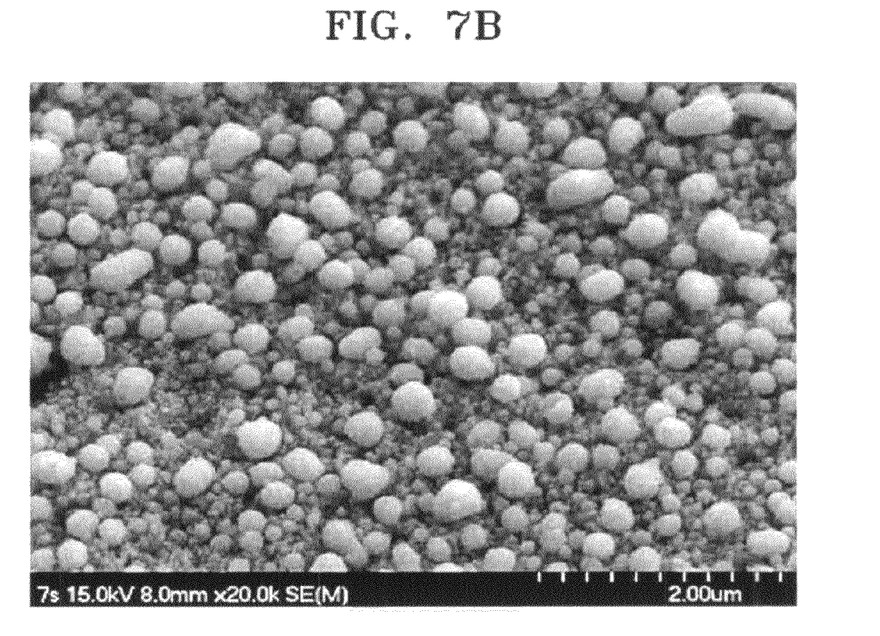
Figure 7C:
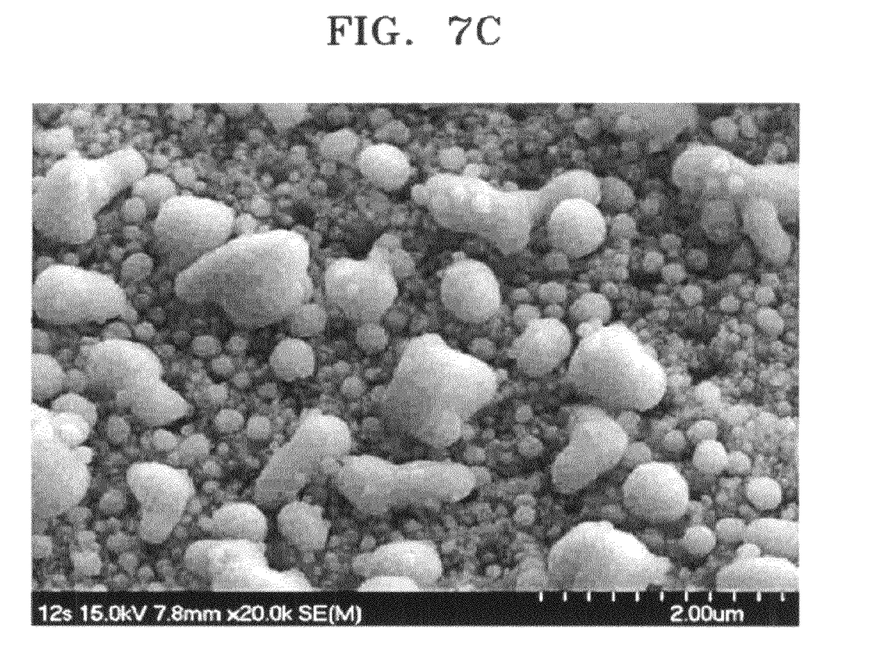

FIGS. 7A to 7C are scanning electron microscope (SEM) images of the surface of the ITO electrode patterned by wet-etching for about 0 second, 7 seconds, and 12 seconds, respectively, and then annealing at approximately 600° C. The surfaces of the ITO electrodes illustrated in FIGS. 7B and 7C may be rougher in comparison to the surface of the ITO electrode which may not be etched illustrated in FIG. 7A. The surface patterned by etching for about 7 seconds and then annealing at approximately 600° C., as illustrated in FIG. 7B, may have finer particles with a diameter within the range of approximately 250 to 550 nm. The light generated in the light emitting device may be extracted because the size of the surface-patterned structure may be similar to the wavelength of the generated light (405 nm) of the light emitting device according to example embodiments. Thus, the light emitting device may have a higher light output power of about 32% as illustrated in FIG. 6. The surface patterned by etching for about 12 seconds and then annealing at approximately 600° C. may have larger particles within the range of about 500 to 1000 nm, and the particles may be agglomerated as illustrated in FIG. 7C. As such, the light generated in the light emitting device may be more likely reflected into the light emitting device rather than extracted because the particle sizes may be slightly larger than the wavelength of the generated light (e.g., about 405 nm). Accordingly, the light emitting device may have a lower light output power of about 19% as illustrated in FIG. 6. Such lower light output power may be similar to the lower light output power of a light emitting device having an electrode patterned using a micro-scale having less than 20%.

Figure 8A:
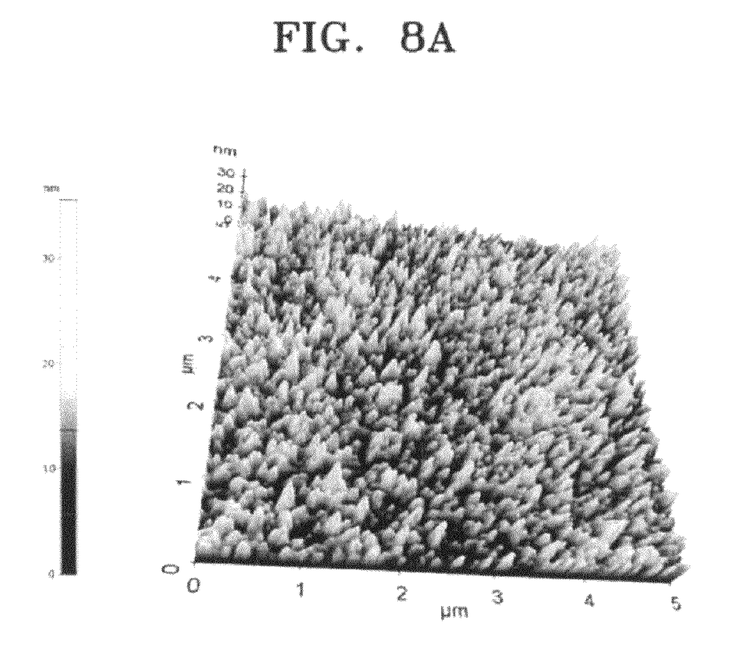
FIGS. 8A to 8C are atomic force microscope (AFM) images of the surface of a p-type electrode of a near-ultraviolet light emitting device patterned by wet-etching and annealing according to an example embodiment.
Figure 8B:
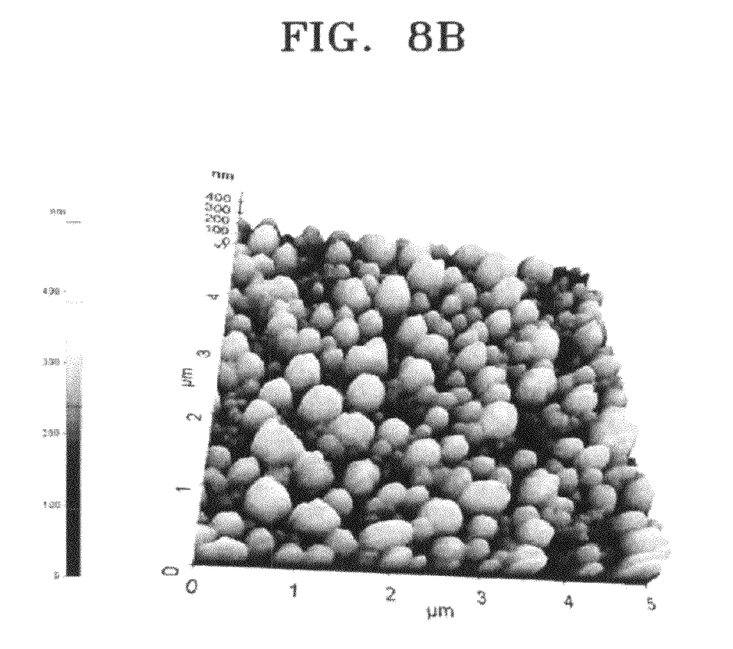
Figure 8C:
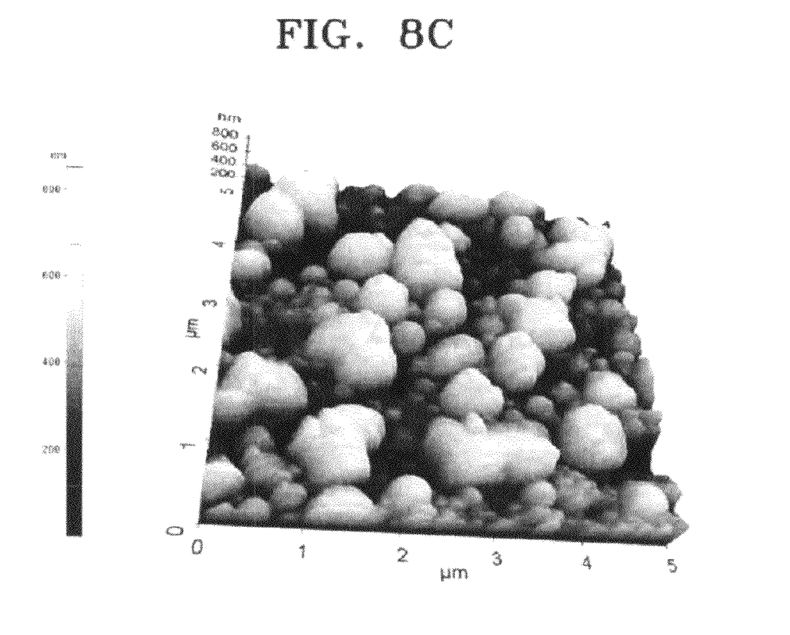

FIGS. 8A to 8C are atomic force microscope (AFM) images of the surface of light emitting devices described in FIGS. 7A to 7C. The surface of light emitting devices patterned by etching for 0 second, 7 seconds and 12 seconds and then annealing at 600° C. may have a roughness of about 4.1 nm, 74.3 nm, and 142 nm, respectively.

Figure 9A:
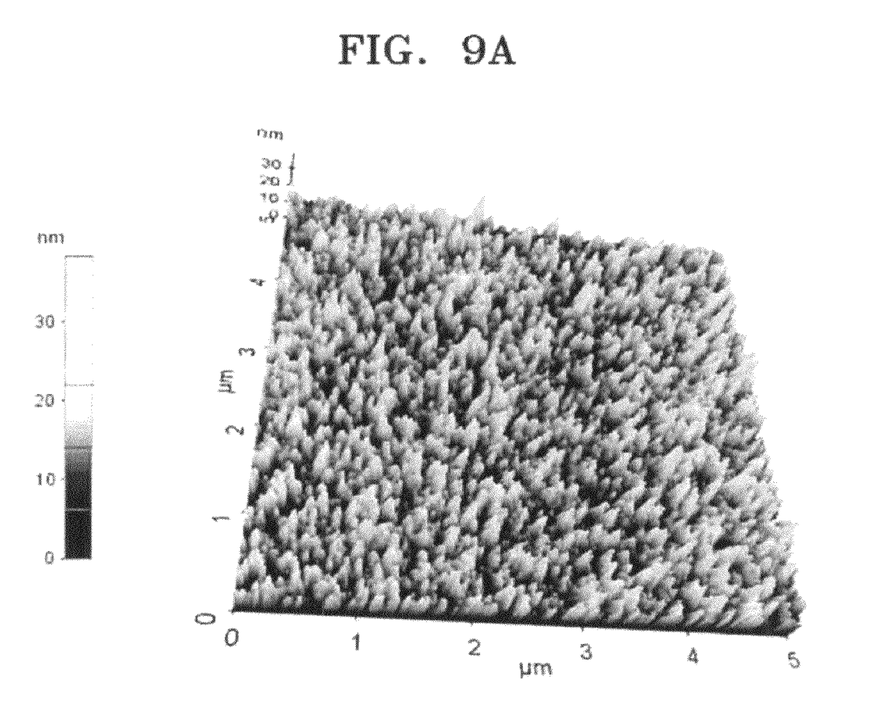
FIGS. 9A to 9C are atomic force microscope (AFM) images of the surface of a wet-etched p-type electrode of a near-ultraviolet light emitting device according to an example embodiment.
Figure 9B:
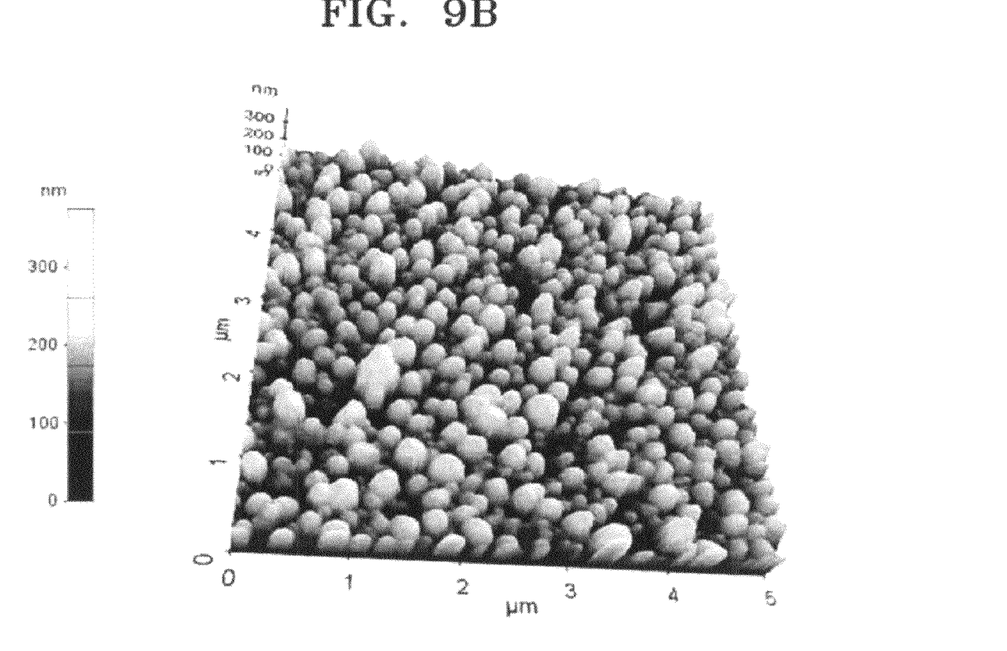
Figure 9C:
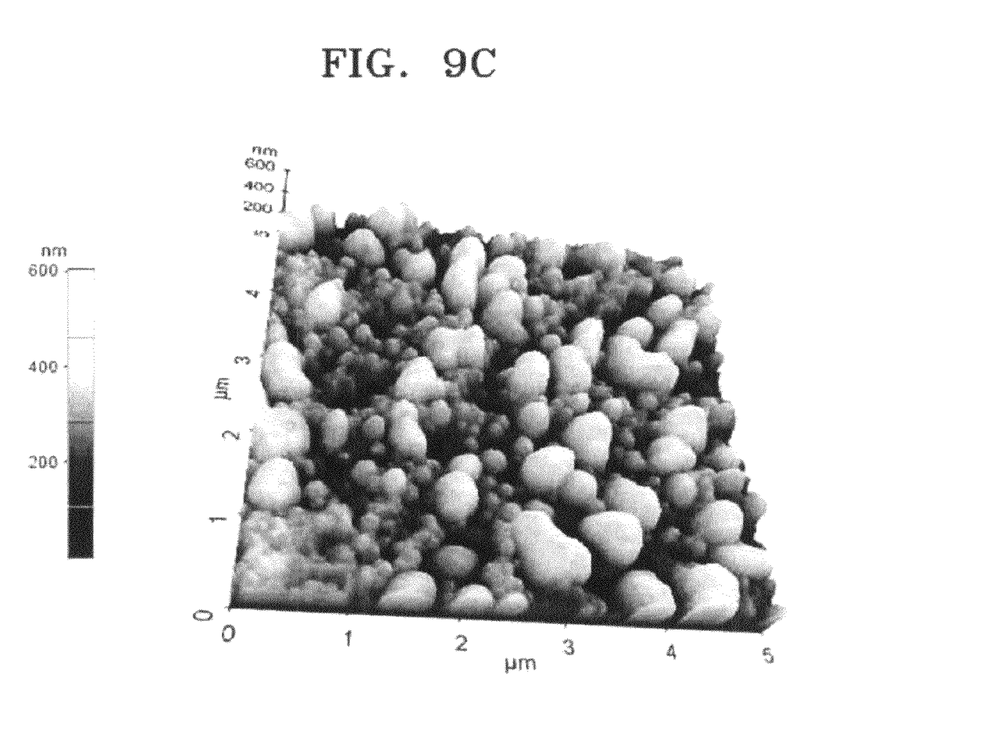

FIGS. 9A to 9C are atomic force microscope (AFM) images of the surface of light emitting devices patterned by wet-etching for about 0 second, 7 seconds, and 12 seconds, respectively. The surface of the light emitting devices patterned by wet-etching for 0 second, 7 seconds, and 12 seconds may have a roughness of about 4 nm, 43.9 nm, and 90.6 nm, respectively. The ITO electrode may have a different surface before and after annealing. For example, when the surface having a roughness of about 43.9 nm after being etched for about 7 seconds is then annealed at approximately 600° C., the roughness of the surface of the sample may increase to about 74.3 nm as illustrated in FIG. 9B. Adjacent finer particles on the surface agglomerate through annealing, and thus the particle sizes of the surface may increase. However, a roughness of the patterned surface may be determined by the etching time before annealing even though the roughness of the patterned surface may slightly increase through annealing. Thus, the etching time may need to be controlled for forming the transparent conductive thin film having a patterned surface according to example embodiments.

According to a method of manufacturing an N-based light emitting device of example embodiments, a transparent conductive thin film nano-scale patterned by wet-etching and then annealing without using a mask may be prepared. In particular, a top-emitting N-based light emitting device having an increased or maximized light extraction rate in which light generated in the device may exit by employing the nano-scale patterned transparent conductive thin film as a p-type electrode may be prepared. Thus, optical characteristics of the N-based light emitting device may be improved.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of manufacturing an N-based light emitting device, the method comprising:
   forming a transparent conductive thin film having an amorphous surface on a p-type clad layer of a light emitting structure in which an n-type clad layer, an active layer, and the p-type clad layer are sequentially stacked on a substrate;
   wet-etching the amorphous surface of the transparent conductive thin film to form nano-scale patterns; and
   annealing the wet-etched transparent conductive thin film so as to transform the amorphous surface having the nano-scale patterns into a polycrystalline surface having crystallized nano-scale patterns, after the step of wet-etching.

2. The method of claim 1, further comprising:
   forming a metal thin film having a thickness within the range of about 0.1 to 50 nm on the p-type clad layer prior to forming the transparent conductive thin film.

3. The method of claim 2, wherein the metal thin film is formed of one selected from the group consisting of metals of Ni, Co, Cu, Pd, Pt, Ru, Ir, Au, Ag, Cr, Rh, In, Sn, Mg, Zn, Be, Sr, and Ba, or an alloy thereof; or a solid solution comprising two or more of the metals.

4. The method of claim 1, wherein the transparent conductive thin film is formed of a transparent conductive oxide which is a combination of O and at least one selected from the group consisting of In, Sn, Zn, Ga, Ce, Cd, Mg, Be, Ag, Mo, V, Cu, Ir, Rh, Ru, W, Co, Ni, Mn, Al, and La.

5. The method of claim 1, wherein the transparent conductive thin film is formed to a thickness within the range of about 10 to 700 nm.

6. The method of claim 1, wherein the wet-etching of the transparent conductive thin film is performed at a temperature within the range of about room temperature to 300° C. for approximately 0.1 seconds to 1 hour.

7. The method of claim 1, wherein the annealing of the wet-etched transparent conductive thin film is performed at a temperature within the range of about room temperature to 900° C. for approximately 10 seconds to 3 hours.

8. The method of claim 7, wherein the annealing of the wet-etched transparent conductive thin film is performed in a vacuum or a gas ambient containing at least one of nitrogen ($N_2$), argon (Ar), helium (He), oxygen ($O_2$), hydrogen ($H_2$), and air.

9. The method of claim 1, wherein the wet-etching of the transparent conductive thin film is performed using an undiluted solution selected from the group consisting of buffered oxide etch (BOE), hydrofluoric acid (HF), hydrochloric acid (HCl), nitric acid ($HNO_3$), phosphoric acid ($H_3PO_4$), sulfuric acid ($H_2SO_4$), potassium hydroxide (KOH), oxalic acid, tartaric acid, formic acid, acetic acid, and glycolic acid, a mixture of the undiluted solutions, a diluted solution of the undiluted solution, or a mixture of the undiluted solutions diluted in deionized water.

10. The method of claim 1, wherein the polycrystalline surface has a surface roughness ranging from 43.9 nm to 142 nm.

11. A method of manufacturing an N-based light emitting device, comprising:
   forming a transparent conductive thin film having an amorphous surface on a p-type clad layer of a light emitting structure, the light emitting structure including an n-type clad layer, an active layer, and the p-type clad layer sequentially stacked on a substrate;
   wet-etching the amorphous surface of the transparent conductive thin film without using a mask to form nano-scale patterns; and
   annealing the wet-etched transparent conductive thin film so as to transform the amorphous surface having the nano-scale patterns into a polycrystalline surface having crystallized nano-scale patterns, after the step of wet-etching.

* * * * *